United States Patent
Shin et al.

(10) Patent No.: US 7,555,094 B2
(45) Date of Patent: Jun. 30, 2009

(54) COUNTER CAPABLE OF HOLDING AND OUTPUTTING A COUNT VALUE AND PHASE LOCKED LOOP HAVING THE COUNTER

(75) Inventors: Jong-shin Shin, Anyang-si (KR); Ji-young Kim, Osan-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 177 days.

(21) Appl. No.: 11/636,452

(22) Filed: Dec. 11, 2006

(65) Prior Publication Data

US 2007/0133735 A1 Jun. 14, 2007

(30) Foreign Application Priority Data

Dec. 14, 2005 (KR) .................... 10-2005-0123176

(51) Int. Cl.
*G11C 19/00* (2006.01)
(52) U.S. Cl. .......................................... 377/54; 377/64
(58) Field of Classification Search ................... None
See application file for complete search history.

(56) References Cited

U.S. PATENT DOCUMENTS 5,848,074 A * 12/1998 Maeno ....................... 714/720
6,661,294 B2 * 12/2003 Terashima et al. ............ 331/17
7,292,177 B2 * 11/2007 Muramatsu et al. .......... 341/164
7,308,634 B2 * 12/2007 Kiryu .......................... 714/733
2005/0068111 A1   3/2005 Kasahara et al.

FOREIGN PATENT DOCUMENTS

| JP | 10-075174 | 3/1998 |
| JP | 2002-314411 | 10/2002 |
| KR | 10-0266691 B | 6/1998 |
| KR | 10-2003-0084739 | 11/2003 |

* cited by examiner

*Primary Examiner*—Cassandra Cox
(74) *Attorney, Agent, or Firm*—Harness, Dickey & Pierce, PLC

(57) ABSTRACT

Example embodiments may provide a counter capable of outputting a count value after holding the count value for an amount of time and a phase locked loop (PLL) including the counter. The counter may include a selection unit that may selectively output a clock signal and a hold signal in response to a selection signal and a counting unit that may perform a counting operation in response to the clock signal and output a count value obtained by the counting operation after holding the count value for an amount of time in response to the hold signal. The counter may stably output an accurate count value regardless of transmission delays.

16 Claims, 4 Drawing Sheets

COUNTER CAPABLE OF HOLDING AND OUTPUTTING A COUNT VALUE AND PHASE LOCKED LOOP HAVING THE COUNTER

PRIORITY STATEMENT

This application claims the benefit of Korean Patent Application No. 10-2005-0123176, filed on Dec. 14, 2005, in the Korean Intellectual Property Office, the disclosure of which is incorporated herein in its entirety by reference.

BACKGROUND

1. Field

Example embodiments relate to a counter and a phase locked loop (PLL), for example, to a counter capable of outputting a count value after holding the count value and a PLL having a counter capable of the same.

2. Description of the Related Art

Related art asynchronous counters, which may include a plurality of flip-flops, may count a clock signal by sequentially transmitting the clock signal through the flip-flops.

However, transmission delays are likely to occur in related art asynchronous counters during sequential transmission of a clock signal through the plurality of flip-flops. Due to such transmission delays, timing of the clock signal may vary from one flip-flop to another in a related-art asynchronous counter so that, for any time period, some flip-flops may have already received a clock signal and started counting the clock signal, whereas other flip-flops may have not even received the clock signal. Accordingly, a related art asynchronous counter may not be able to precisely count the clock signal. For example, if the flip-flops of the related art asynchronous counter have to output count values before completing clock signal transmission through the flip-flops, there is a high probability that the flip-flops will output inaccurate count values.

For example, in the case of counting a high-frequency clock signal, the time required for a clock signal to transmit through all flip-flops of a related art asynchronous counter is generally longer than the period of the clock signal, thus aggravating the aforementioned problem with related art asynchronous counters.

Phase locked loops (PLLs) are circuits that may output an oscillation clock signal with a desired locking frequency. PLLs may output an oscillation clock signal with a desired locking frequency by comparing the frequency of a current oscillation clock signal against a target locking frequency and accordingly altering the frequency of the current oscillation clock signal. In order to determine whether the frequency of a current oscillation clock signal is identical to a desired locking frequency, PLLs may learn the frequency of the current oscillation clock signal. However, since it may be impossible for related art asynchronous counters to accurately count a clock signal, PLLs may not precisely determine the frequency of a current oscillation clock signal and thus may not output an oscillation clock signal with a desired locking frequency.

SUMMARY

Example embodiments may provide a counter which may output a count value after holding the count value.

Example embodiments may provide a phase locked loop (PLL) including a counter that may output a count value after holding the count value.

Example embodiments may provide a counter including: a selection unit that may selectively output a clock signal and/or a hold signal in response to a selection signal and a counting unit that obtains a count value by a counting operation in response to the clock signal, holds the count value for an amount of time in response to the hold signal, and outputs the held count value.

Example embodiments may provide a phase locked loop (PLL) including: a voltage controlled oscillator (VCO) that may choose a band in response to a band selection signal and may output an oscillation clock signal corresponding to an oscillation control voltage; a counter that may perform a counting operation in response to an oscillation clock signal, may output an oscillation frequency as the result of the counting operation, may output the oscillation frequency after holding the oscillation frequency for a desired amount of time in response to a hold signal, wherein, and/or may output the oscillation frequency after holding the frequency for a desired amount of time in response to an input hold signal; and/or a frequency state controller that may compare the oscillation frequency with a reference frequency and may output the result of the comparison as the band selection signal.

BRIEF DESCRIPTION OF THE DRAWINGS

The above and other features and/or advantages of example embodiments will become more apparent by describing some of them in detail with reference to the attached drawings in which.

DETAILED DESCRIPTION OF EXAMPLE EMBODIMENTS

Figure 1:
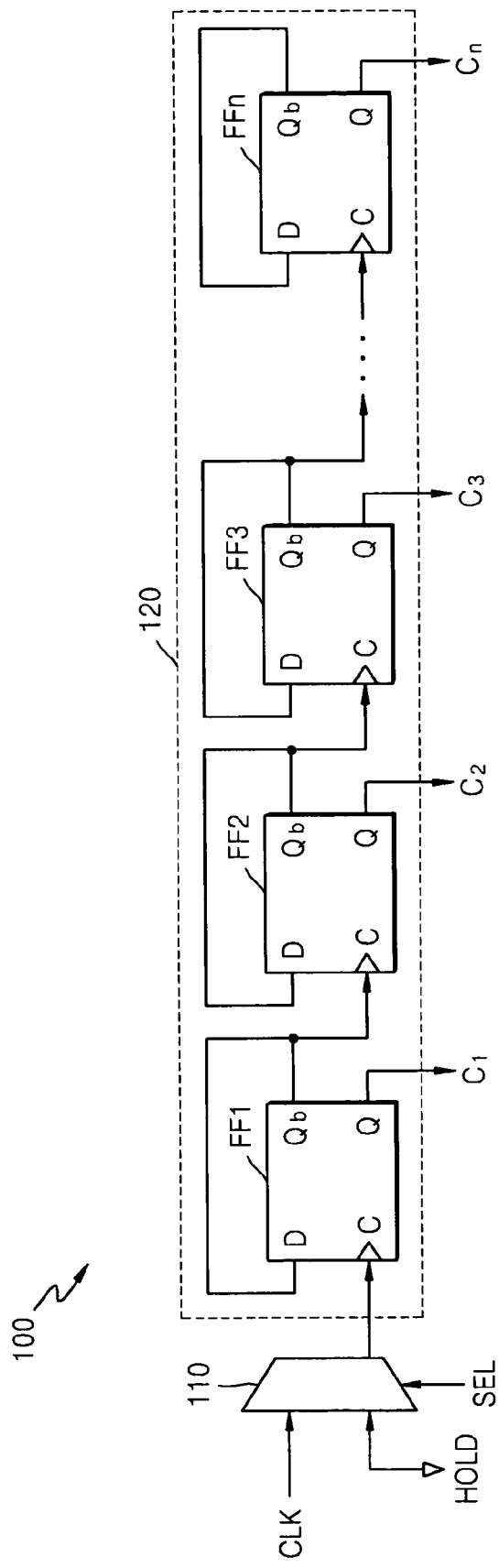
FIG. 1 is a circuit diagram of a counter that may output a count value after holding the count value for a-desired amount of time according to an example embodiment.

Detailed example embodiments are disclosed herein. However, specific structural and/or functional details disclosed herein are merely representative for purposes of describing example embodiments. This invention may, however, may be embodied in many alternate forms and should not be construed as limited to only example embodiments set forth herein.

It will be understood that when a component is referred to as being "on," "connected to" or "coupled to" another component, it can be directly on, connected to or coupled to the other component or intervening components may be present. In contrast, when a component is referred to as being "directly on," "directly connected to" or "directly coupled to" another component, there are no intervening components present. As used herein, the term "and/or" includes any and all combinations of one or more of the associated listed items.

It will be understood that, although the terms first, second, third, etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one component or feature's relationship to another component(s) or feature(s) as illustrated in the drawings. It will be understood that the spatially relative terms are intended to encompass different orientations of the device in use or operation in addition to the orientation depicted in the figures.

The terminology used herein is for the purpose of describing particular example embodiments only and is not intended to be limiting. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, and/or components.

Unless otherwise defined, all terms (including technical and/or scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Reference will now be made to example embodiments, which are illustrated in the accompanying drawings, wherein like reference numerals refer to the like components throughout.

FIG. 1 shows a circuit diagram of an example embodiment counter 100 that may output a count value after holding it for a desired amount of time. As shown in FIG. 1, the counter 100 may include a selection unit 110 and/or a counting unit 120.

The selection unit 110 may selectively output a clock signal CLK or a hold signal HOLD in response to a selection signal SEL. The selection unit 110 may be a multiplexer.

The counting unit 120 may count a clock signal CLK and may generate count signals $C_1$ thorough $C_n$. The clock signal CLK's clock number may include the count signals $C_1$ thorough $C_n$. If the hold signal HOLD is input to the counting unit 120 while the counting unit 120 counts the clock signal CLK, the counting unit 120 may hold the count signal obtained from counting for a desired amount of time. The counting unit 120 may include a plurality of first through nth latch units FF1 through FFn (where n is a natural number) that may be connected in series. Each of the first through nth latch units FF1 through FFn may output first through nth count signals $C_1$ through $C_N$ of the clock signal CLK. Each of the first through nth latch units FF1 through FFn may hold the corresponding count signals $C_1$ through $C_n$ and then output the first through nth count signals $C_1$ through $C_n$.

For example, the selection unit 110 may output the clock signal CLK to the counting unit 120. Then the selection unit 110 may output the hold signal HOLD to the counting unit 120. The clock signal CLK and/or the hold signal HOLD may be sequentially transmitted to the counting unit 120 and/or may pass through the first through nth latch units FF1 through FFn. The latch units FF1 through FFn may each respectively output count numbers $C_1$ through $C_N$ after holding them for a time sufficient for the clock signal CLK, which may be input to the latch units FF1 through FFn before the hold signal HOLD is input, to transmit through all latch units FF1 through FFn.

As shown in FIG. 1, the first through nth latch units FF1 through FFn may be flip-flops, for example, D-flip-flops. An input terminal D and an output terminal $Q_b$ of each of the D-flip-flops FF1 through FFn may be connected. The D-flip-flop FF1 may receive the hold signal HOLD transmitted by the selection unit 110 via a C input terminal of the first D-flip-flop FF1 and/or may output the hold signal HOLD to the second D-flip-flop FF2 via the output terminal $Q_b$ of the first D-flip-flop FF1. The kth D-flip-flop FFk (where k is a natural number satisfying the following inequality: $2 \leq k \leq n-1$) may receive, via an input terminal C of the kth D-flip-flop FFk, the hold signal HOLD output by the (k−1)th D-flip-flop FF(k−1), and/or may output the hold signal HOLD to the (k+1)th D-flip-flop FF(k+1) via the output terminal $Q_b$ of kth D-flip-flop FFk. The nth D-flip-flop FFn may receive, via an input terminal C of the nth D-flip-flop FFn, the hold signal HOLD output by the (n−1)th D-flip-flop FF(n−1).

The latch units FF1 through FFn may be other types of flip-flops, for example, T-flip-flops. In this example, the first T-flip-flop FF1 may receive the hold signal HOLD transmitted by the selection unit 110 via an input terminal T of the first T-flip-flop FF1, and/or may output the hold signal HOLD to the second T-flip-flop FF2 via the output terminal $Q_b$ of the first T-flip-flop FF1. The kth T-flip-flop FFk (where k is a natural number satisfying the following inequality: $2 \leq k \leq N-1$) may receive, via an input terminal T of the kth T-flip-flop FFk, the hold signal HOLD output by the (k−1)th T-flip-flop FF(k−1), and/or may output the hold signal HOLD to the (k+1)th T-flip-flop FF(k+1) via the output terminal $Q_b$ of the kth T-flip-flop FFk. The nth T-flip-flop FFn may receive, via an input terminal T of the nth T-flip-flop FFn, the hold signal HOLD output by the (n−1)th T-flip-flop FF(n−1).

Figure 2:
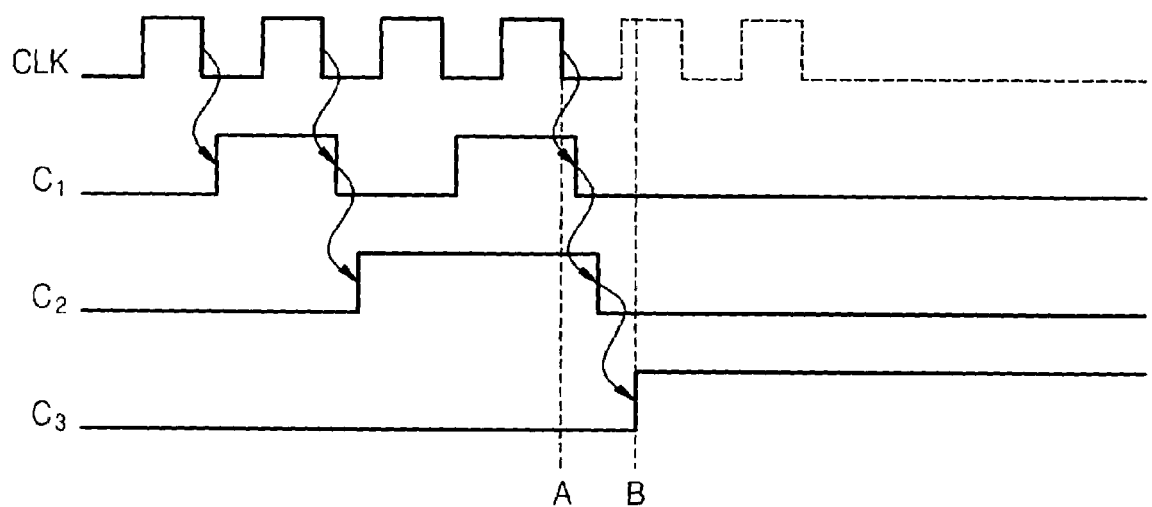
FIG. 2 is a timing diagram illustrating an example operation of the example counter illustrated in FIG. 1.

FIG. 2 is an example embodiment of a timing diagram that illustrates an operation of an example counter 100 illustrated in FIG. 1. The counter 100 may include three flip-flops FF1 through FF3, and count signals $C_1$ through $C_3$ may be output respectively by the three flip-flops and may be three bits long.

In a counting mode, the selection unit 110 may output the clock signal CLK. In an output mode, the selection unit 110 may output the hold signal HOLD. The flip-flops FF1 through FF3 may sequentially count the clock signal CLK. The first flip-flop FF1 may invert a logic state of the first count signal $C_1$, which may be previously stored in the first flip-flop FF1, in synchronization with a rising or falling edge of the clock signal CLK. The second flip-flop FF2 may invert a logic state of the second count signal $C_2$, which may be previously stored in the second flip-flop FF2, in synchronization with a rising or falling edge of a count value stored in the first flip-flop FF1. Similarly, the third flip-flop FF3 may invert a logic state of the count signal $C_3$, which may be previously stored in the third flip-flop FF3, in synchronization with a rising edge or a falling edge of a count value $C_2$ stored in the second flip-flop FF2.

In the output mode, the selection unit 110 may stop outputting the clock signal CLK and/or may output the hold signal HOLD with a desired or predetermined logic value. The hold signal HOLD may be a ground voltage. The flip-flops FF1 through FF3 may sequentially perform a counting operation, for example, the sequence described above, in response to the clock signal CLK, until the hold signal HOLD is input. If the hold signal HOLD is input to the flip-flops FF1 through FF3 while they count the clock signal CLK, the flip-flops FF1 through FF3 may stop performing a counting operation in response to the hold signal HOLD. Flip-flops FF1 through FF3 may maintain the logic states of the count signals $C_1$ through $C_3$ respectively as they were before the hold signal HOLD is input.

FIG. 2 illustrates an example embodiment where the hold signal HOLD may be input to the flip-flops FF1 through FF3 four clock pulses later than the clock signal CLK.

As shown in FIG. 2, the flip-flops FF1 through FF3 may perform a counting operation until the fourth clock pulse of the clock signal CLK is input. After a third falling edge of the clock signal CLK is input, the first flip-flop FF1 may store a logic value of 1, the second flip-flop FF2 may store a logic value of 1, and the third flip-flop FF3 may store a logic value of 0. If a fourth clock pulse of the clock signal CLK is input, the flip-flops FF1 through FF3 may sequentially count the clock signal CLK in synchronization with a fourth falling edge of the clock signal CLK. The first flip-flop FF1 may change its stored logic value from 1 to 0, the second flip-flop FF2 may change its stored logic value from 1 to 0, and the third flip-flop FF3 may change its stored logic value from 0 to 1.

If the hold signal HOLD, which may be a ground voltage, is input, the flip-flops FF1 through FF3 may maintain logic values of count signals $C_1$ through $C_3$ respectively at the same value as before the hold signal HOLD was input. For example, the first flip-flop FF1 may maintain a logic value of the first count signal $C_1$ at 0, the second flip-flop FF2 may maintain a logic value of the second count signal $C_2$ at 1, and the third flip-flop FF3 may maintain a logic value of the third count number signal $C_3$ at 1.

If the hold signal HOLD is input and sequentially transmitted to the flip-flops FF1 through FF3, the clock signal CLK may not be input to those flip-flops FF1 through FF3, as illustrated by dotted lines of FIG. 2. If the hold signal HOLD is sequentially transmitted, the flip-flops FF1 through FF3 may sequentially stop performing a counting operation and may hold their stored logic values before the hold signal HOLD is input.

In a related art asynchronous counter, a clock signal may be continuously transmitted to a plurality of flip-flops even in a time period between A and B. A plurality of count signals output by the flip-flops during and after the time period between A and B may be inaccurate.

According to example embodiments, if the hold signal HOLD is input while the flip-flops FF1 through FF3 output the count signals $C_1$ through $C_3$ respectively, the counter 100 may stop counting the clock signal CLK and may hold the logic values of the stored count signals $C_1$ through $C_3$ before the hold signal HOLD is input. After a transmission delay time, which may be represented by the time period between A and B, elapses, the flip-flops FF1 through FF3 may output their stored logic values before the hold signal HOLD is input. The transmission delay time may be the time taken for the clock signal CLK, which may be input to the counter 100 before the hold signal HOLD is input, to transmit the first through third flip-flops, for example FF1 through FF3. According to example embodiments, the counter 100 may stably output an accurate count value by properly counting the number of pulses of the clock signal CLK.

Figure 3:
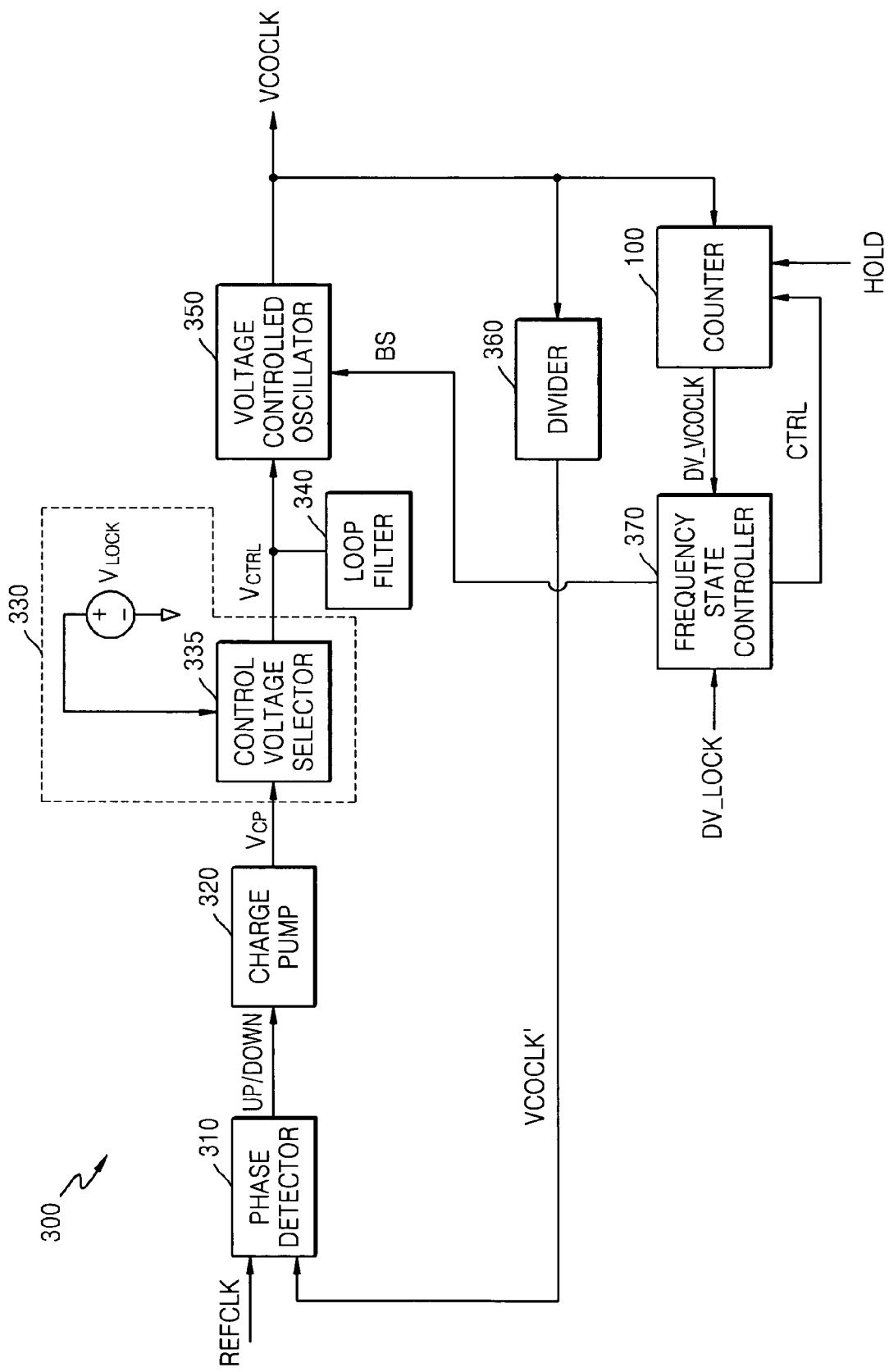
FIG. 3 is a block diagram of an example phase locked loop (PLL) including an example embodiment of a counter illustrated in FIG. 1.

FIG. 3 is a block diagram of an example embodiment phase locked loop (PLL) 300 including an example embodiment of counter 100 illustrated in FIG. 1. As shown in FIG. 3, the PLL may include a phase detector 310, a charge pump 320, a control voltage output unit 330, a loop filter 340, a voltage controlled oscillator (VCO) 350, a divider 360, the counter 100, and/or a frequency state controller 370.

The phase detector 310 may compare the phase of a reference clock signal REFCLK frequency against the phase of a divided oscillation clock signal VCOCLK_DIV frequency and may output the result of the comparison as an up signal UP or a down signal DOWN. For example, if the divided oscillation frequency is lower than the reference frequency, the phase detector 310 may output the up signal UP. If the divided oscillation frequency is higher than the reference frequency, the phase detector 310 may output the down signal DOWN.

The charge pump 320 may convert a pulse signal into a voltage $V_{CP}$ in response to the up signal UP or the down signal DOWN output by the phase detector 310.

The control voltage output unit 330 may choose the voltage $V_{CP}$ output by the charge pump 320 or a locking voltage $V_{LOCK}$ and may output the chosen voltage as an oscillation control voltage $V_{CTRL}$.

If the frequency state controller 370 and the VCO 350 perform a band selection operation while in a band selection mode, the control voltage output unit 330 may output the locking voltage $V_{LOCK}$. Locking voltage $V_{LOCK}$ may correspond to a desired frequency of an oscillation clock signal VCOCLK. For example, the locking voltage $V_{LOCK}$ may be a voltage to which the PLL 300 may be locked. The locking voltage $V_{LOCK}$ may be about one-half VDD, where VDD represents a power supply voltage. In band selection mode, the control voltage output unit 330 may output the locking voltage $V_{LOCK}$ as the oscillation control voltage $V_{CTRL}$.

In a mode other than the band selection mode, for instance, in a regular mode when the frequency state controller 370 and the VCO 350 may not perform a band selection operation, the control voltage output unit 330 may output the voltage $V_{CP}$ output by the charge pump 320 as the oscillation control voltage $V_{CTRL}$.

The loop filter 340 may include a low pass filter (LPF). The loop filter 340 may accumulate and/or output electric charge received from the charge pump 320 and may remove a noise frequency including undesirable output components from the voltage $V_{CP}$ output by the charge pump 320.

The VCO 350 may choose a band in response to a band selection signal BS and may output the oscillation clock signal VCOCLK that may correspond to the oscillation control voltage $V_{CTRL}$.

The counter 100 may perform a counting operation in response to the oscillation clock signal VCOCLK and may output a digital value DV_VCOCLK corresponding to the oscillation frequency fVCOCLK as the result of the counting operation. If a hold signal HOLD is input, the counter 100 may output the digital value DV_VCOCLK after holding the digital value DV_VCOCLK for a desired amount of time in response to the hold signal HOLD. The amount of time may be the time taken for the oscillation clock signal VCOCLK, which may be input to the counter 100 before the hold signal HOLD is input, to transmit through the counter 100, for example, a transmission delay time of the oscillation clock signal VCOCLK.

If the hold signal HOLD is input to the counter 100 while the counter 100 counts the oscillation clock signal VCOCLK, the counter 100 may stop counting the oscillation clock signal VCOCLK and may maintain the digital value DV_VCOCLK as it was before the hold signal HOLD was input. After the transmission delay time of the oscillation clock signal VCOCLK elapses, the counter 100 may output the digital value DV_VCOCLK of the oscillation frequency fVCOCLK of the oscillation clock signal VCOCLK.

The frequency state controller 370 may compare the digital value DV_VCOCLK with a digital value DV_LOCK corresponding to the locking frequency $f_{LOCK}$ and may output the result of the comparison as the band selection signal BS. The frequency state controller 370 may receive the digital value DV_VCOCLK from the counter 100, compare the digital value DV_VCOCLK with the digital value DV_LOCK corresponding to a locking frequency, select the band in which the digital value DV_VCOCLK of the oscillation frequency $f_{VCOCLK}$ is closer to the digital value DV_LOCK corresponding to a locking frequency, and/or output the band selection signal BS corresponding to the selected band to the VCO 350. The VCO 350 may choose the desired band in response to the band selection signal BS output by the frequency state controller 370 using the method described above.

Figure 4:
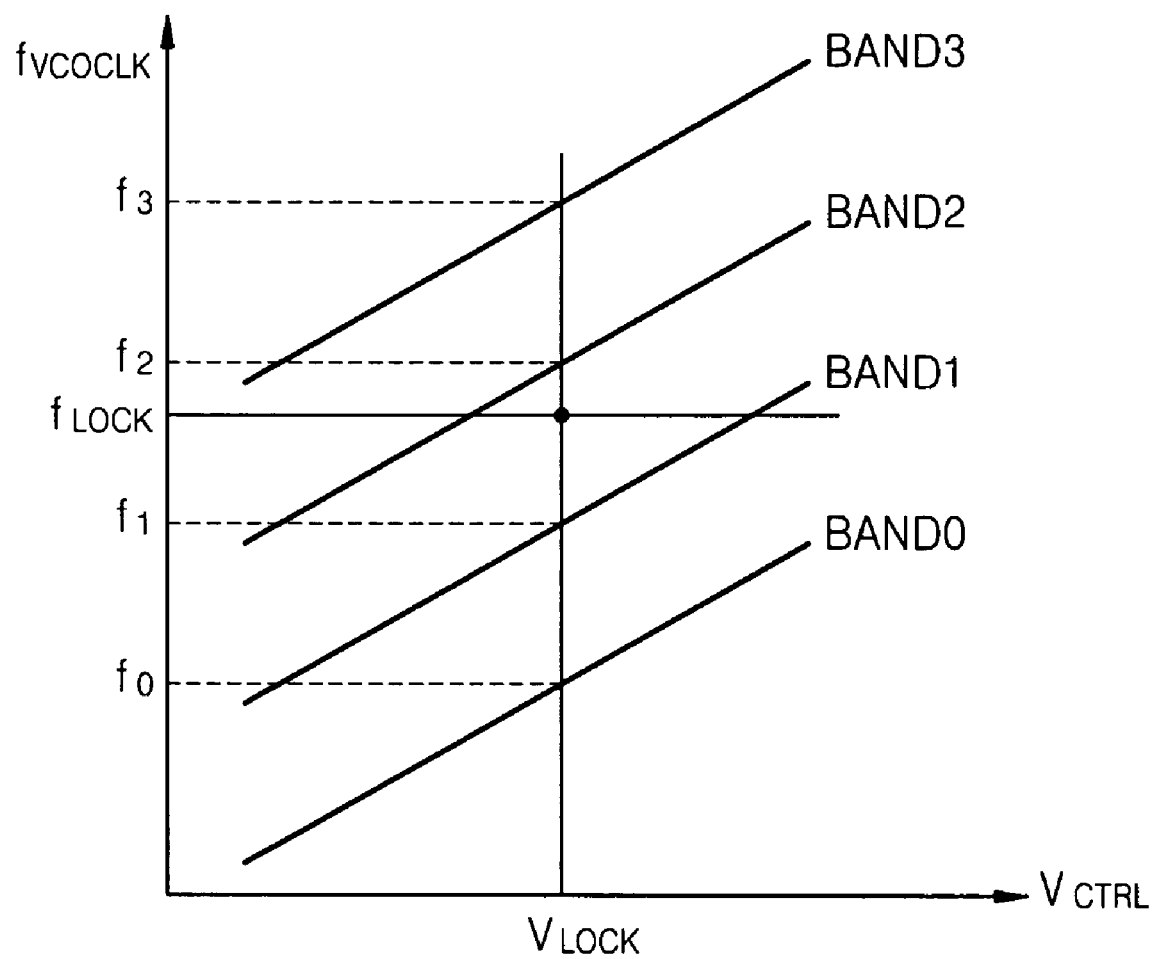
FIG. 4 is a graph illustrating the relationship between an example oscillation control voltage and an example oscillation frequency of the example PLL illustrated in FIG. 3.

FIG. 4 is a graph illustrating the relationship between an example oscillation control voltage $V_{CTRL}$ and an example oscillation frequency $f_{VCOCLK}$ for a plurality of bands BAND0 through BAND3 of the example PLL 300 illustrated in FIG. 3. An example embodiment of a method for determining the oscillation frequency $f_{VCOCLK}$ of an oscillation clock signal VCOCLK which is performed by the PLL 300 will now be described with reference to FIG. 4. As described above, in band selection mode, a locking voltage $V_{LOCK}$ may be output as the oscillation control voltage $V_{CTRL}$. If a digital value DV_VCOCLK of the oscillation frequency $f_{VCOCLK}$ is greater than a digital value DV_LOCK of a locking frequency $f_{LOCK}$ (for example, $f_3$ of BAND3), the frequency state control unit 370 may output a band selection signal BS corresponding to a lower band (for example, $f_2$ of BAND2). If the digital value DV_VCOCLK of the oscillation frequency $f_{VCOCLK}$ is smaller than the digital value DV_LOCK of the locking frequency $f_{LOCK}$ (for example, $f_0$ of BAND0), the frequency state control unit 370 may output a band selection signal BS corresponding to an upper band (for example, $f_1$ of BAND1). By repeating the aforementioned operation, the frequency state controller 370 may allow the VCO 350 to choose a band including a frequency closest to the locking frequency $f_{LOCK}$.

For example, in the band selection mode when the locking voltage $V_{LOCK}$ is output as the oscillation control voltage $V_{CTRL}$, the second band BAND2 that corresponds to a frequency closest to the locking frequency $f_{LOCK}$ (for example, $f_2$) may be chosen. This frequency (for example, $f_2$) may be set as the oscillation frequency $f_{VCOCLK}$.

An example embodiment of a method for counting a clock signal may include selectively outputting a clock signal or a hold signal in response to a desired selection signal, receiving the clock signal and/or counting the clock signal, holding for a desired amount of time a count signal obtained as the result of the counting operation in response to the hold signal, and outputting the count signal after the desired amount of time elapses.

Example embodiments of a method of counting a clock signal are substantially the same as and correspond to an example embodiment of operation of the counter which outputs a count signal after holding it for a desired amount of time.

As described above, example embodiments of a counter may stably output an accurate count value regardless of transmission delays.

While example embodiments have been particularly shown and described with reference to the figures, it will be understood by those of ordinary skill in the art that various changes in form and details may be made therein without departing from the spirit and scope of the example embodiments in the following claims.

What is claimed is:

1. A counter comprising:
   a selection unit that outputs a clock signal and a hold signal in response to a selection signal; and
   a counting unit that obtains a count value by a counting operation in response to the clock signal, holds the count value for an amount of time in response to the hold signal, and outputs the held count value, the counting unit including a plurality of latch units through which the clock signal and the hold signal are sequentially transmitted.

2. The counter of claim 1, wherein the plurality of latch units are connected in series and each latch unit outputs one bit of the count value.

3. The counting unit of claim 2, wherein, each of the plurality of latch units holds the count value for an amount of time in response to the hold signal and outputs one bit of the count value when the hold signal is input.

4. The counter of claim 1, wherein the selection unit outputs the clock signal before outputting the hold signal.

5. The counter of claim 3, wherein the amount of time is equal to a transmission delay time equal to the time taken for the clock signal to transmit through the plurality of latch units.

6. The counter of claim 3, wherein each latch unit is a flip-flop.

7. The counter of claim 6, wherein each flip-flop is a D-flip-flop.

8. The counter of claim 7, wherein each D-flip-flop includes an input terminal and an output terminal connected to each other.

9. The counter of claim 8, wherein each D-flip-flop receives, via the input terminal, the hold signal and outputs, via the output terminal, the hold signal to a next D-flip-flop in the plurality of flip-flops.

10. The counter of claim 6, wherein each flip-flop is a T-flip-flop.

11. The counter of claim 10, wherein each T-flip-flop receives, via the input terminal, the hold signal and outputs, via the output terminal, the hold signal to a next T-flip-flop in the plurality of flip-flops.

12. The counter of claim 1, wherein the hold signal has a constant logic level.

13. The counter of claim 1, wherein the hold signal is a ground voltage.

14. A method of counting a clock signal comprising:
   selectively outputting a clock signal or a hold signal in response to a selection signal;
   receiving the clock signal and counting the clock signal;
   receiving a hold signal in sequence with the clock signal;
   holding for an amount of time a count value obtained from the counting; and
   outputting the count value after the amount of time elapses.

15. The method of claim 14, wherein the clock signal is output before the hold signal.

16. The method of claim 14, wherein the hold signal has a constant logic level.

* * * * *